United States Patent
Park

(10) Patent No.: US 10,210,913 B2
(45) Date of Patent: Feb. 19, 2019

(54) SEMICONDUCTOR APPARATUS INCLUDING A SENSE AMPLIFIER CONTROL CIRCUIT

(71) Applicant: SK hynix Inc., Icheon-si Gyeonggi-do (KR)

(72) Inventor: Mun Phil Park, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/661,778

(22) Filed: Jul. 27, 2017

(65) Prior Publication Data

US 2018/0254072 A1  Sep. 6, 2018

(30) Foreign Application Priority Data

Mar. 6, 2017  (KR) .................. 10-2017-0028197

(51) Int. Cl.
*G11C 7/06* (2006.01)
*G11C 7/08* (2006.01)

(52) U.S. Cl.
CPC ............. *G11C 7/08* (2013.01); *G11C 7/062* (2013.01); *G11C 7/065* (2013.01)

(58) Field of Classification Search
CPC ..................................................... G11C 7/062
USPC ............................................ 365/208, 189.07
See application file for complete search history.

(56) References Cited

U.S. PATENT DOCUMENTS

| 6,385,119 | B2 * | 5/2002 | Kobayashi | G05F 3/242 365/226 |
| 7,800,969 | B2 * | 9/2010 | Kang | G11C 11/4091 365/204 |
| 8,354,863 | B2 * | 1/2013 | Lee | G11C 7/08 327/198 |
| 9,275,693 | B1 * | 3/2016 | Hwang | G11C 7/08 |

FOREIGN PATENT DOCUMENTS

KR  1020070097804 A  10/2007

* cited by examiner

*Primary Examiner* — Son Mai
(74) *Attorney, Agent, or Firm* — William Park & Associates Ltd.

(57) ABSTRACT

A semiconductor apparatus includes a sense amplifier configured to sense data transmitted through a data line and a sense amplifier control circuit configured to detect whether a level of an external voltage is equal to or larger than an reference voltage level and control a power voltage of the sense amplifier according to a detection result.

18 Claims, 6 Drawing Sheets

SEMICONDUCTOR APPARATUS INCLUDING A SENSE AMPLIFIER CONTROL CIRCUIT

CROSS-REFERENCES TO RELATED APPLICATION

The present application claims priority under 35 U.S.C. § 119(a) to Korean application number 10-2017-0028197, filed on Mar. 6, 2017, in the Korean Intellectual Property Office, which is incorporated herein by reference in its entirety.

BACKGROUND

1. Technical Field

Various embodiments may generally relate to a semiconductor circuit, and more particularly, to a semiconductor apparatus including a sense amplifier control circuit.

2. Related Art

Semiconductor circuits may include sense amplifiers configured to sense and amplify input/output (I/O) data.

In semiconductor circuits, a word line coupled to a memory cell may be activated and data stored in the memory cell may be transmitted to a bit line.

The data transmitted through the bit line may be sensed and amplified through a bit line sense amplifier and may be transmitted through an I/O line coupled to the bit line, for example, a segment line.

An overdriving operation which provides a high driving voltage to a bit line sense amplifier may be performed in an initial sensing operation to improve a sensing rate of the bit line sense amplifier.

SUMMARY

Various embodiments are provided to a semiconductor apparatus including a sense amplifier control circuit capable of improving operation performance of a sense amplifier.

In an embodiment of the present disclosure, a semiconductor apparatus may include: a sense amplifier configured to sense data transmitted through a data line; and a sense amplifier control circuit configured to detect whether a level of an external voltage is equal to or larger than an reference voltage level and control a power voltage of the sense amplifier according to a detection result.

In an embodiment of the present disclosure, a semiconductor apparatus may include: a sense amplifier configured to sense data transmitted through a data line; a voltage detector configured to detect whether a level of a first external voltage is equal to or larger than an internal reference voltage level and generate a voltage detection signal according to a detection result; a clamping circuit configured to output a first driving voltage by adjusting the level of the first external voltage according to the voltage detection signal; and a switching circuit configured to apply the first driving voltage to the sense amplifier according to sense amplifier control signals.

In another embodiment of the present disclosure, a semiconductor apparatus may include: a sense amplifier configured to sense data transmitted through a data line; a voltage detector configured to detect whether a level of a first external voltage is equal to or larger than an internal reference voltage level and generate a voltage detection signal according to a detection result; a switching circuit configured to apply a first driving voltage or a second driving voltage to the sense amplifier according to sense amplifier control signals; and a clamping circuit configured to output the second driving voltage by adjusting the level of the first external voltage according to the voltage detection signal and a sense amplifier enable signal. The switching circuit may be configured to interrupt application of the first driving voltage to the sense amplifier when the level of the first external voltage is equal to or larger than the internal reference voltage level.

In another embodiment of the present disclosure, a semiconductor apparatus may include: a sense amplifier configured to sense data transmitted through a data line; a voltage detector configured to detect whether a level of a first external voltage is equal to or larger than an internal reference voltage level and generate a voltage detection signal according to a detection result; a driver configured to drive an output node according to the first external voltage or a second external voltage; and a switching circuit configured to interrupt application of the first external voltage to the sense amplifier through the output node according to the voltage detection signal and apply a voltage of the output node to the sense amplifier according to a sense amplifier enable signal.

These and other features, aspects, and embodiments are described below in the section entitled "DETAILED DESCRIPTION".

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present disclosure will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The present disclosure is described herein with reference to cross-section and/or plan illustrations of idealized embodiments of the present disclosure. However, embodiments of the present disclosure should not be construed as limiting the inventive concept. Although a few embodiments of the present disclosure will be shown and described, it will be appreciated by those of ordinary skill in the art that changes may be made in these embodiments without departing from the principles and spirit of the present disclosure.

Figure 1:
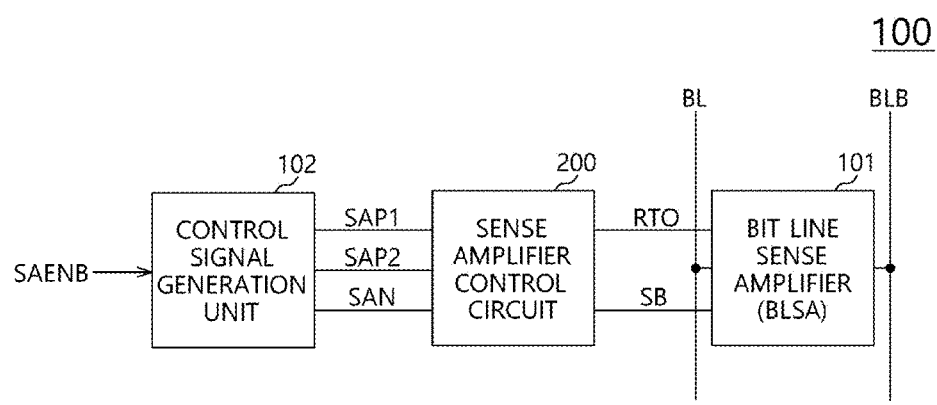
FIG. 1 is a diagram illustrating a configuration of a semiconductor apparatus according to an embodiment of the present disclosure.

As illustrated in FIG. 1, a semiconductor apparatus 100 according to an embodiment may include a bit line sense amplifier (BLSA) 101, a control signal generation unit 102, and a sense amplifier control circuit 200.

The bit line sense amplifier 101 may be coupled to a data line, for example, a bit line pair BL and BLB.

The bit line sense amplifier 101 may sense and amplify data transmitted through the bit line pair BL and BLB according to a power voltage, for example, a first sense amplifier voltage RTO and a second sense amplifier voltage SB.

For example, the bit line sense amplifier 101 may include a plurality of transistors coupled to the bit line BL and a bit bar line BLB to form a cross-coupled latch structure.

The control signal generation unit 102 may generate sense amplifier control signals SAP1, SAP2, and SAN, for example, a first pull-up control signal SAP1, a second pull-up control signal SAP2, and a pull-down control signal SAN according to a sense amplifier enable signal SAENB.

The sense amplifier control circuit 200 may generate the first sense amplifier voltage RTO and the second sense amplifier voltage SB according to the sense amplifier control signals SAP1, SAP2, and SAN.

The sense amplifier control circuit 200 may detect whether a level of an external voltage is equal to or larger than an internal reference voltage level and generate the first sense amplifier voltage RTO using a first driving voltage having the level of the external voltage which is dropped according to a detection result.

The first driving voltage may have a voltage level for an overdriving operation of the bit line sense amplifier 101.

Examples of an internal configuration of the sense amplifier control circuit 200 according to embodiments will be described with reference to FIGS. 3 to 9.

Figure 2:
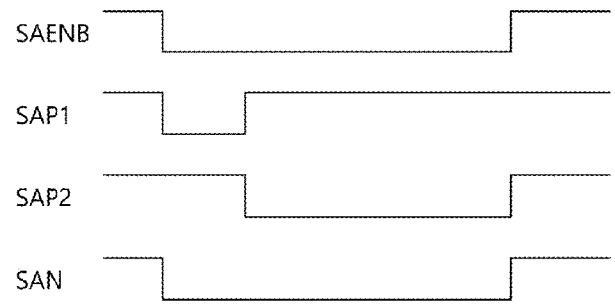
FIG. 2 is a timing diagram illustrating an output signal of a control signal generation unit of FIG. 1.

The control signal generation unit 102 may be logic-designed to generate the sense amplifier control signals SAP1, SAP2, and SAN having timings as illustrated in FIG. 2.

The first pull-up control signal SAP1 may be used as a signal for controlling the sense amplifier overdriving and may be activated to logic low for a preset time as the sense amplifier enable signal SAENB is activated to logic low.

The second pull-up control signal SAP2 may be activated to logic low from a time that the first pull-up control signal SAP1 is inactivated and the second pull-up control signal SAP2 may be inactivated at a time that the sense amplifier enable signal SAENB is inactivated.

The pull-down control signal SAN may have the same activation period as the sense amplifier enable signal SAENB.

The activation periods of the sense amplifier control signals SAP1, SAP2, and SAN may be merely exemplary and the sense amplifier control signals SAP1, SAP2, and SAN may be variously modified. For example, portions of the sense amplifier control signals SAP1, SAP2, and SAN may have a certain overlapping period or may not be generated. The logic design of the control signal generation unit 102 may be changed according to the modification of the sense amplifier enable signals.

Figure 3:
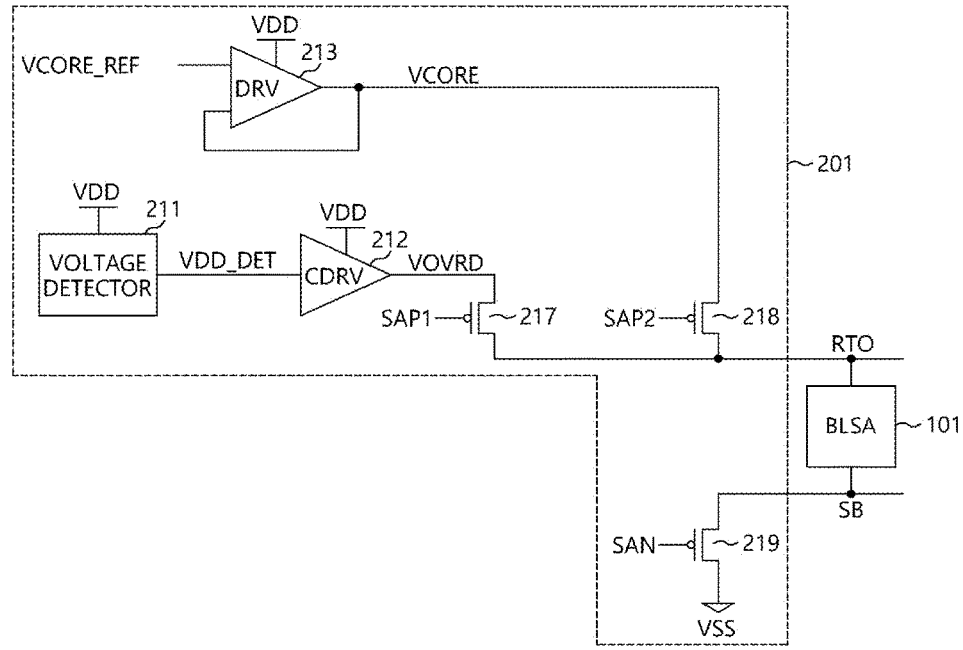
FIG. 3 is a diagram illustrating a configuration of a sense amplifier control circuit according to an embodiment of the present disclosure.

As illustrated in FIG. 3, a sense amplifier control circuit 201 according to an embodiment may include a voltage detector 211, a clamping circuit (CDRV) 212, a driver 213, and switching circuits 217 to 219.

The voltage detector 211 may detect whether the level of a first external voltage VDD is equal to or larger than the internal reference voltage level and generate a voltage detection signal VDD_DET having different levels according to a detection result. Further, the sense amplifier control circuit 201 may control a power voltage of the bit line sense amplifier 101 according to the detection result.

For example, the voltage detector 211 may output the voltage detection signal VDD_DET of an activation level (logic high) when the level of the first external voltage VDD is equal to or larger than the internal reference voltage level and output the voltage detection signal VDD_DET of an inactivation level (logic low) when the level of the first external voltage VDD is smaller than the internal reference voltage level.

The internal reference voltage level of the voltage detector 211 may be trimmed using a test mode signal or a fuse set.

The clamping circuit 212 may adjust the level of the first external voltage VDD according to the voltage detection signal VDD_DET and output the level-adjusted first external voltage as a first driving voltage VOVRD.

For example, when the voltage detection signal VDD_DET has the activation level, the clamping circuit 212 may drop the first external voltage VDD a predetermined level and output the level-dropped first external voltage as the first driving voltage VOVRD, and when the voltage detection signal VDD_DET has the inactivation level the clamping circuit 212 may output the first external voltage VDD as the first driving voltage VOVRD as it is. In other words, the sense amplifier control circuit 201 may drop a level of the first external voltage VDD by a preset level and apply the level-dropped external voltage to the bit line sense amplifier 101 when the level of the first external voltage VDD is equal to or larger than the internal reference voltage level.

The clamping level, for example, the level of the first external voltage VDD dropped in the clamping circuit 212 may be trimmed using a test mode signal or a fuse set.

The driver 213 may perform a voltage generation operation. For example, the driver 213 may perform an operation which maintains the second driving voltage VCORE to a desired level by comparing a level of the second driving voltage VCORE and a reference voltage VCORE_REF, where the second driving voltage VCORE is varied according to the first external voltage VDD and is fed back from the output terminal of the driver 213.

The second driving voltage VCORE may have a lower level than the first external voltage VDD and may have a voltage level for a normal driving operation of the bit line sense amplifier 101, for example, for a driving operation after the overdriving operation of the bit line sense amplifier 101.

The switching circuits 217 to 219 may apply the first driving voltage VOVRD or the second driving voltage VCORE as the first sense amplifier voltage RTO to the bit line sense amplifier 101 and apply a ground voltage VSS as the second sense amplifier voltage SB to the bit line sense amplifier 101, according to the sense amplifier control signals SAP1, SAP2, and SAN.

A first switch 217 to a third switch 219 constituting the switching circuits 217 to 219 may be configured as PMOS transistors.

A source terminal of the first switch 217 may receive the first driving voltage VOVRD, a gate terminal of the first switch 217 may receive the first pull-up control signal SAP1, and a drain terminal of the first switch 217 may be coupled to the sense amplifier 101.

The first switch 217 may apply the first driving voltage VOVRD as the first sense amplifier voltage RTO to the bit line sense amplifier 101 when the first pull-up control signal SAP1 is logic low.

A source terminal of the second switch 218 may receive the second driving voltage VCORE, a gate terminal of the second switch 218 may receive the second pull-up control signal SAP2, and a drain terminal of the second switch 218 may be coupled to the sense amplifier 101.

The second switch 218 may apply the second driving voltage VCORE as the first sense amplifier voltage RTO to the bit line sense amplifier 101 when the second pull-up control signal SAP2 is logic low.

A source terminal of the third switch 219 may receive the ground voltage VSS, a gate terminal of the third switch 219 may receive the pull-down control signal SAN, and a drain terminal of the third switch 219 may be coupled to the sense amplifier 101.

The third switch 219 may apply the ground voltage VSS as the second sense amplifier voltage SB to the bit line sense amplifier 101 when the pull-down control signal SAN is logic low. Accordingly, the sense amplifier control circuit 201 may control the power voltage of the bit line sense amplifier 101 according to the sense amplifier control signals SAP1, SAP2, and SAN.

The first external voltage VDD may be a voltage applied from the outside and may have various levels according to an operation environment and the like of a system in association with the semiconductor apparatus according to the exemplary embodiment. For clarity, the first external voltage VDD may be divided into high VDD/low VDD.

When a level of the first external voltage VDD is out of a desired range of the semiconductor apparatus, the first sense amplifier voltage RTO generated using the first external voltage VDD may serve as noise of the bit line sense amplifier 101 and thus the offset characteristics may be degraded.

Accordingly, when the voltage detection signal VDD_DET is activated in the exemplary embodiment, the first driving voltage VOVRD which is the first external voltage VDD dropped by a preset clamping level may be applied to the bit line sense amplifier 101 as the first sense amplifier voltage RTO.

When the voltage detection signal VDD_DET is inactivated in the exemplary embodiment, the first driving voltage VOVRD having the same level as the first external voltage VDD may be applied to the bit line sense amplifier 101 as the first sense amplifier voltage RTO.

Figure 4:
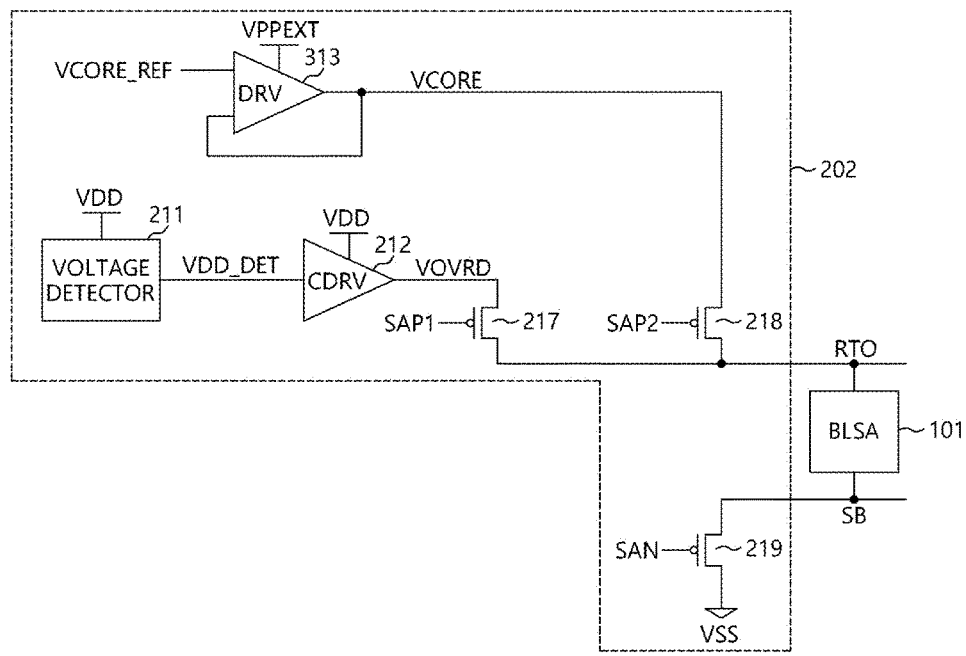
FIG. 4 is a diagram illustrating a configuration of a sense amplifier control circuit according to another embodiment of the present disclosure.

As illustrated in FIG. 4, a sense amplifier control circuit 202 according to another exemplary embodiment may include a voltage detector 211, a clamping circuit (CDRV) 212, a driver 313, and switching circuits 217 to 219.

The sense amplifier control circuit 202 according to another exemplary embodiment may have the same configuration as the sense amplifier control circuit 201 of FIG. 3, but the sense amplifier control circuit 202 may be different from the sense amplifier control circuit 201 of FIG. 3 in that the driver 313 is configured to generate the second driving voltage VCORE using a second external voltage VPPEXT.

The second external voltage VPPEXT may have a higher level than the first external voltage VDD. Accordingly, the driver 313 may generate the second driving voltage VCORE having a greater stable level.

Figure 5:
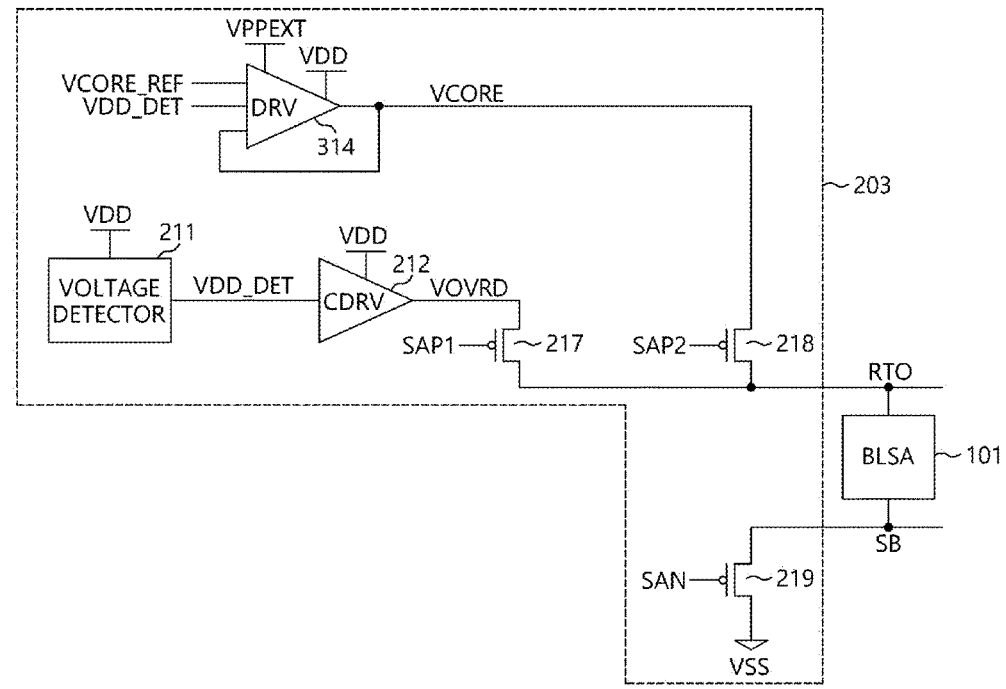
FIG. 5 is a diagram illustrating a configuration of a sense amplifier control circuit according to another embodiment of the present disclosure.

As illustrated in FIG. 5, a sense amplifier control circuit 203 according to another exemplary embodiment may include a voltage detector 211, a clamping circuit (CDRV) 212, a driver 314, and switching circuits 217 to 219.

The sense amplifier control circuit 203 of FIG. 5 according to another exemplary embodiment may have the same configuration as the sense amplifier control circuit 201 of FIG. 3, but the sense amplifier control circuit 203 may be different from the sense amplifier control circuit 201 of FIG. 3 in that the driver 314 is configured to generate the second driving voltage VCORE using the first external voltage VDD or the second external voltage VPPEXT according to the voltage detection signal VDD_DET.

The driver 314 may generate the second driving voltage VCORE by selecting the first external voltage VDD or the second external voltage VPPEXT according to the voltage detection signal VDD_DET.

When the voltage detection signal VDD_DET is activated to logic high, the driver 314 may select the first external voltage VDD and when the voltage detection signal VDD_DET is inactivated to logic low, the driver 314 may select the second external voltage VPPEXT.

The driver 314 may maintain the second driving voltage VCORE to a desired level by comparing a level of the second driving voltage VCORE to the reference voltage VCORE_REF, where second driving voltage VCORE may be varied according to the first external voltage VDD or the second external voltage VPPEXT and is fed back from the output terminal of the driver 314.

Figure 6:
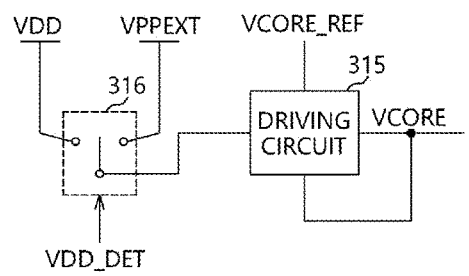
FIG. 6 is a diagram illustrating a configuration of a driver of FIG. 5.

As illustrated in FIG. 6, the driver 314 may include a driving circuit 315 and a switch 316.

The driving circuit 315 may maintain the second driving voltage VCORE to a desired level by comparing a level, which is varied according to an external power voltage, for example, the first external voltage VDD or the second external voltage VPPEXT and is fed back from the output terminal of the driving circuit 315, and the reference voltage VCORE_REF.

The switch 316 may select the first external voltage VDD when the voltage detection signal VDD_DET is activated to logic high, select the second external voltage VPPEXT when the voltage detection signal VDD_DET is inactivated to logic low, and apply the selected external voltage as the external power voltage to the driving circuit 315.

Figure 7:
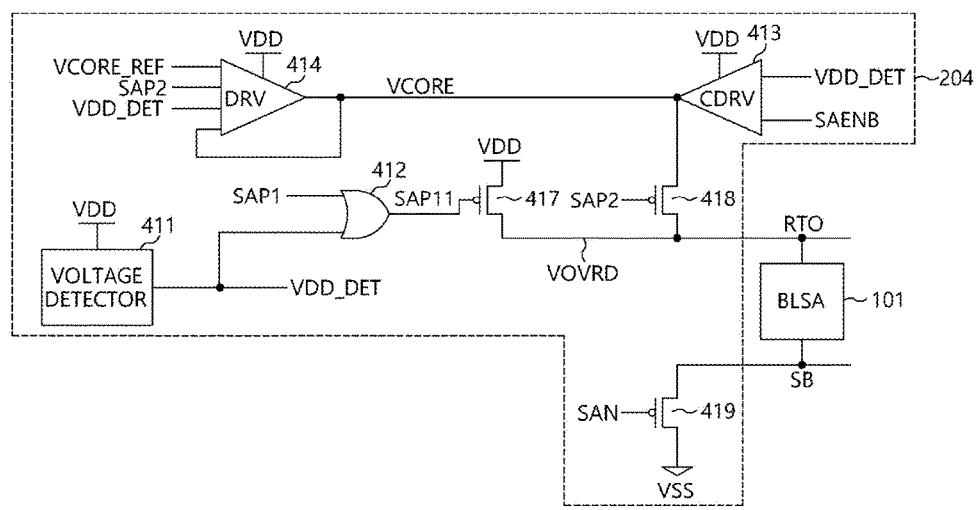
FIG. 7 is a diagram illustrating a configuration of a sense amplifier control circuit according to another embodiment of the present disclosure.

As illustrated in FIG. 7, a sense amplifier control circuit 204 according to another exemplary embodiment may include a voltage detector 411, a logic gate 412, a clamping circuit (CDRV) 413, a driver 414, and switching circuits 417 to 419.

The voltage detector 411 may detect whether the level of the first external voltage VDD is equal to or larger than the internal reference voltage level and generate the voltage detection signal VDD_DET having different levels according to a detection result.

For example, the voltage detector 411 may output the voltage detection signal VDD_DET of an activation level (logic high) when the level of the first external voltage VDD is equal to or larger than the internal reference voltage level, and output the voltage detection signal VDD_DET of an inactivation level (logic low) when the level of the first external voltage VDD is smaller than the internal reference voltage level.

The internal reference voltage level of the voltage detector 411 may be trimmed using a test mode signal or a fuse set.

The logic gate 412 may generate an overdriving control signal SAP11 by performing a logic OR operation on the first pull-up control signal SAP1 and the voltage detection signal VDD_DET.

The logic gate 412 may inactivate the overdriving control signal SAP11 regardless of the first pull-up control signal SAP1 when the voltage detection signal VDD_DET is activated to logic high.

The clamping circuit 413 may adjust the level of the first external voltage VDD according to the voltage detection signal VDD_DET and the sense amplifier enable signal SAENB and output the level-adjusted first external voltage as the second driving voltage VCORE.

For example, when the voltage detection signal VDD_DET has the activation level, the clamping circuit 413 may drop the first external voltage VDD by a predetermined level and output the level-dropped first external voltage as the second driving voltage VCORE for a period that the sense amplifier enable signal SAENB is activated to logic low.

When the voltage detection signal VDD_DET has the inactivation level, the clamping circuit 413 may output the first external voltage VDD as the second driving voltage VCORE for the period that the sense amplifier enable signal SAENB is activated to logic low.

The clamping level, for example, the level of the first external voltage VDD dropped in the clamping circuit 413 may be trimmed using a test mode signal or a fuse set.

The driver 414 may generate the second driving voltage VCORE using the first external voltage VDD, the reference voltage VCORE_REF, the voltage detection signal VDD_DET, and the second pull-up control signal SAP2.

The driver 414 may perform the voltage generation operation for a period that both the voltage detection signal VDD_DET and the second pull-up control signal SAP2 are activated.

The voltage generation operation may be an operation which maintains the second driving voltage VCORE to a desired level by comparing a level, which is varied according to the first external voltage VDD and is fed back from the output terminal of the driver 414, and the reference voltage VCORE_REF.

The switching circuits 417 to 419 may apply the first driving voltage VOVRD or the second driving voltage VCORE as the first sense amplifier voltage RTO to the bit line sense amplifier 101 and apply the ground voltage VSS as the second sense amplifier voltage SB to the bit line sense amplifier 101, according to the overdriving control signal SAP11, the second pull-up control signal SAP2, and the pull-down control signal SAN.

The switching circuits 417 to 419 may have the same configurations as the switching circuits 217 to 219 of FIG. 3.

Figure 8:
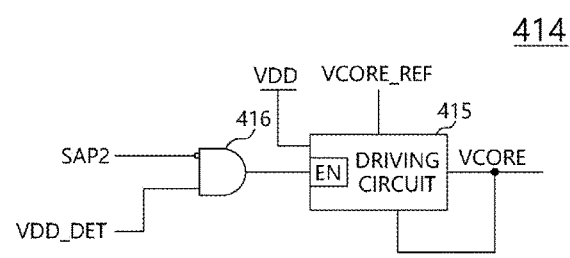
FIG. 8 is a diagram illustrating a configuration of a driver of FIG. 7.

As illustrated in FIG. 8, the driver 414 may include a driving circuit 415 and a logic gate 416.

The driving circuit 415 may maintain the second driving voltage VCORE to a desired level for a period that an enable signal EN is activated by comparing a level of the second driving voltage VCORE and the reference voltage VCORE_REF, where the second driving voltage VCORE is varied according to the first external voltage VDD and is fed back from the output terminal of the driving circuit 415.

The logic gate 416 may perform a logic AND operation on an inverted second pull-up control signal SAP2 and the voltage detection signal VDD_DET and apply a logic AND operation result as the enable signal EN to the driving circuit 415.

The logic gate 416 may activate the enable signal EN to logic high for a period that the second pull-up control signal SAP2 is logic low and the voltage detection signal VDD_DET is logic high.

Figure 9:
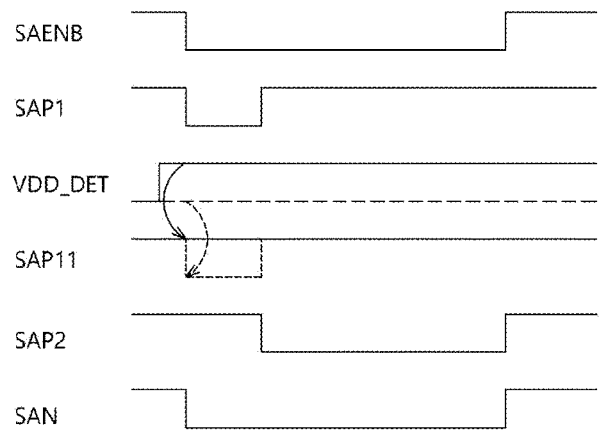
FIG. 9 is a timing diagram illustrating an output signal of the sense amplifier control circuit of FIG. 7.

An operation of the sense amplifier control circuit 204 of FIG. 7 according to another exemplary embodiment will be described with reference to FIG. 9.

As the sense amplifier enable signal SAENB is enabled to logic low, the first pull-up control signal SAP1 may be activated to logic low.

The pull-down control signal SAN may have the same activation period as the sense amplifier enable signal SAENB.

When the voltage detection signal VDD_DET is activated to logic high, the overdriving control signal SAP11 may be inactivated to logic high even when the first pull-up control signal SAP1 is activated to logic low.

When the overdriving control signal SAP11 is inactivated to logic high, the first switch 417 is turned off and the first driving voltage VOVRD having the same level as the first external voltage VDD is not applied to the bit line sense amplifier 101.

As the first pull-up control signal SAP1 is inactivated to logic high, the second pull-up control signal SAP2 may be activated to logic low.

The clamping circuit 413 may output a voltage where the first external voltage VDD is dropped by a preset clamping level to be the second driving voltage VCORE for the period that the sense amplifier enable signal SAENB is activated.

When the second pull-up control signal SAP2 is activated to logic low in a state that the voltage detection signal VDD_DET is activated to logic high, the driver 414 may perform a driving operation for boosting up the second driving voltage VCORE to a desired level using the first external voltage VDD.

For example, because the first external voltage VDD as the first sense amplifier voltage RTO is not applied to the bit line sense amplifier 101 due to the activation of the voltage detection signal VDD_DET, the sensing rate of the bit line sense amplifier 101 may be degraded. Accordingly, the degradation in the sensing rate of the bit line sense amplifier 101 may be compensated through the driving of the clamping circuit 413 and the driver 414.

When the voltage detection signal VDD_DET is inactivated to logic low, the first pull-up control signal SAP1 may be activated to logic low and the overdriving control signal SAP11 may also be inactivated to logic low.

Because the overdriving control signal SAP11 is activated to logic low, the first switch 417 is turned on and the first external voltage VDD may be applied to the bit line sense amplifier 101 as the first sense amplifier voltage RTO.

Accordingly, the bit line sense amplifier 101 may perform the overdriving operation using the first sense amplifier voltage RTO.

The clamping circuit 413 may output the first external voltage VDD as the second driving voltage VCORE for the period that the sense amplifier enable signal SAENB is activated.

Because the voltage detection signal VDD_DET is inactivated to logic low, the operation of the driver 414 may be interrupted.

For example, because the voltage detection signal VDD_DET is inactivated and the overdriving operation of the bit line sense amplifier 101 is normally performed, the driving of the driver 414 may be stopped and only the clamping circuit 413 may be operated.

Figure 10:
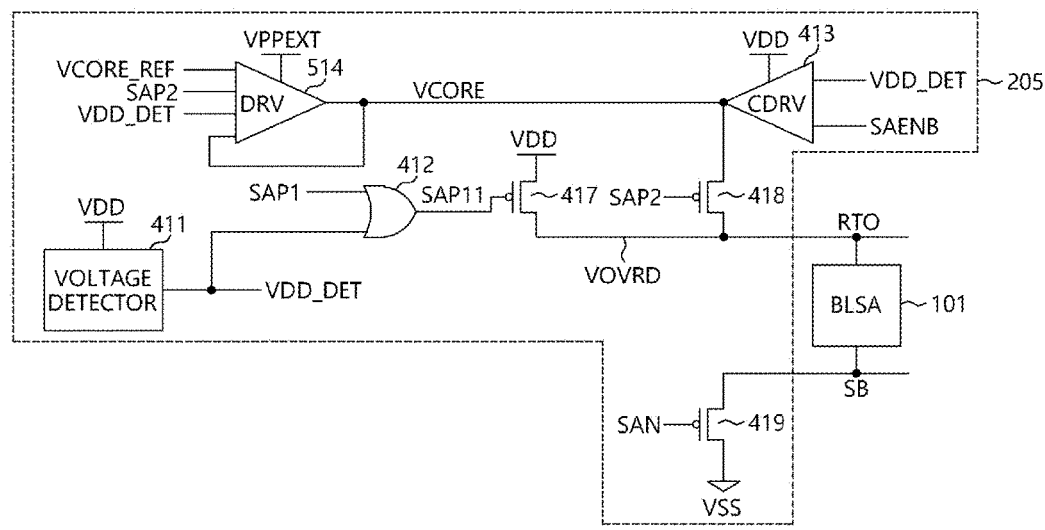
FIG. 10 is a diagram illustrating a configuration of a sense amplifier control circuit according to another embodiment of the present disclosure.

As illustrated in FIG. 10, a sense amplifier control circuit 205 according to another exemplary embodiment may include a voltage detector 411, a logic gate 412, a clamping circuit (CDRV) 413, a driver 514, and switching circuits 417 to 419.

The sense amplifier control circuit 205 according to another exemplary embodiment may have the same configuration as the sense amplifier control circuit 204 of FIG. 7, but the sense amplifier control circuit 205 may be different from the sense amplifier control circuit 204 of FIG. 7 in that the driver 514 is configured to generate the second driving voltage VCORE using the second external voltage VPPEXT.

The second external voltage VPPEXT may have a higher level than the first external voltage VDD. Accordingly, the driver 514 may generate the second driving voltage VCORE having a greater stable level.

Figure 11:
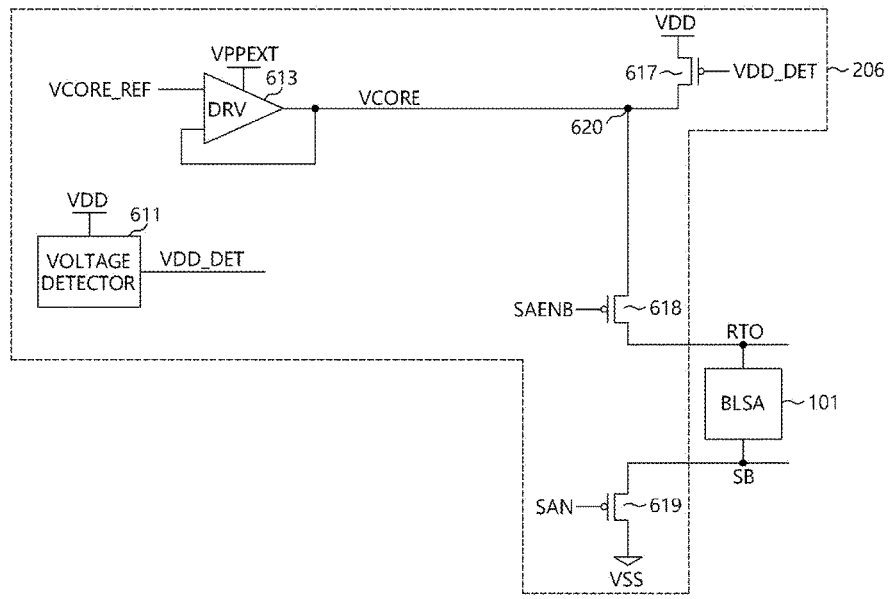
FIG. 11 is a diagram illustrating a configuration of a sense amplifier control circuit according to another embodiment of the present disclosure.

As illustrated in FIG. 11, a sense amplifier control circuit 206 according to another exemplary embodiment may include a voltage detector 611, a driver 613, and switching circuits 617 to 619.

The voltage detector 611 may detect whether the level of the first external voltage VDD is equal to or larger than the internal reference voltage level and generate the voltage detection signal VDD_DET having different levels according to a detection result.

The internal reference voltage level of the voltage detector 611 may be trimmed using a test mode signal or a fuse set.

The driver 613 may perform the voltage generation operation, for example, an operation which maintains the second driving voltage VCORE to a desired level by comparing a level of the second driving voltage VCORE and the reference voltage VCORE_REF, where the second driving voltage VCORE is varied according to the second external voltage VPPEXT and is fed back from the output terminal of the driver 613.

The switching circuits 617 to 619 may apply the second driving voltage VCORE as the first sense amplifier voltage RTO to the bit line sense amplifier 101 and apply the ground voltage VSS as the second sense amplifier voltage SB to the bit line sense amplifier 101, according to the voltage detection signal VDD_DET, the sense amplifier enable signal SAENB, and the pull-down control signal SAN.

A first switch 617 to a third switch 619 constituting the switching circuits 617 to 619 may be configured as PMOS transistors.

A source terminal of the first switch 617 may receive the first external voltage VDD, a gate terminal of the first switch 617 may receive the voltage detection signal VDD_DET, and a drain terminal of the first switch 617 may be coupled to an output node 620 of the driver 613.

The first switch 617 may apply the first external voltage VDD to the output node 620 when the voltage detection signal VDD_DET is logic low.

A source terminal of the second switch 618 may be coupled to the output node 620, a gate terminal of the second switch 618 may receive the sense amplifier enable signal SAENB, and a drain terminal of the second switch 618 may be coupled to the sense amplifier 101.

The second switch 618 may apply the voltage level of the output node 620 as the first sense amplifier voltage RTO to the bit line sense amplifier 101 when the sense amplifier enable signal SAENB is logic low.

A source terminal of the third switch 619 may receive the ground voltage VSS, a gate terminal of the third switch 619 may receive the pull-down control signal SAN, and a drain terminal of the third switch 619 may be coupled to the sense amplifier 101.

The third switch 619 may apply the ground voltage VSS as the second sense amplifier voltage SB to the bit line sense amplifier 101 when the pull-down control signal SAN is logic low.

The sense amplifier control circuit 206 according to another exemplary embodiment may allow the overdriving operation of the bit line sense amplifier 101 to be performed through an associated operation of the driver 613 and the first switch 617 when the level of the first external voltage VDD is smaller than the internal reference voltage level, for example, when the voltage detection signal VDD_DET is inactivated to logic low.

When the level of the first external voltage VDD is equal to or larger than the internal reference voltage level, for example, when the voltage detection signal VDD_DET is activated to logic high, the first switch 617 is turned off and application of the first external voltage VDD through the output node 620 as the first sense amplifier voltage RTO to the bit line sense amplifier 101 may be interrupted.

Figure 12:
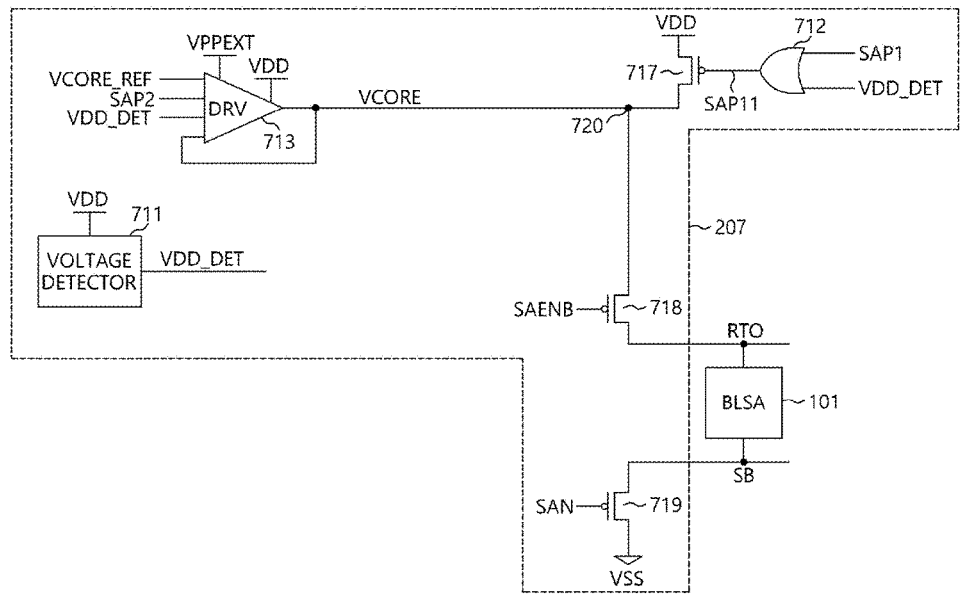
FIG. 12 is a diagram illustrating a configuration of a sense amplifier control circuit according to another embodiment of the present disclosure.

As illustrated in FIG. 12, a sense amplifier control circuit 207 according to another exemplary embodiment may include a voltage detector 711, a logic gate 712, a driver 713, and switching circuits 717 to 719.

The voltage detector 711 may have the same configuration as the voltage detector 611 of FIG. 11.

The logic gate 712 may generate the overdriving control signal SAP11 by performing a logic OR operation on the first pull-up control signal SAP1 and the voltage detection signal VDD_DET. The overdriving control signal SAP11, sense amplifier enable signal SAENB, and pull-down control signal SAN may be sense amplifier control signals.

The logic gate 712 may inactivate the overdriving control signal SAP11 regardless of the first pull-up control signal SAP1 when the voltage detection signal VDD_DET is activated to logic high.

The driver 713 may include a configuration of the driver 314 of FIG. 6.

The driver 713 may perform the voltage generation operation for an activation period of the second pull-up control signal SAP2.

The driver 713 may perform the voltage generation operation by selecting the first external voltage VDD when the voltage detection signal VDD_DET is inactivated to logic low and by selecting the second external voltage VPPEXT when the voltage detection signal VDD_DET is activated to logic high.

The voltage generation operation may be an operation which maintains the second driving voltage VCORE to a desired level by comparing a level of the second driving voltage VCORE and the reference voltage VCORE_REF, where the second driving voltage VCORE is varied according to the first external voltage VDD or the second external voltage VPPEXT and is fed back from the output terminal of the driver 713. The driver 713 may generate the second driving voltage VCORE according to the first external voltage VDD or the second external voltage VPPEXT for a period that any one of the sense amplifier control signals SAP11, SAENB, and SAN and the voltage detection signal VDD_DET are activated. In other words, the driver 713 may be configured to drive the output node 720 according to first external voltage VDD or the second external voltage VPPEXT for a period that any one of the sense amplifier control signals SAN, SAENB, and SAP11 generated according to the sense amplifier enable signal SAENB and the voltage detection signal VDD_DET are activated.

The switching circuits 717 to 719 may provide the second driving voltage VCORE as the first sense amplifier voltage RTO to the bit line sense amplifier 101 and provide the ground voltage VSS as the second sense amplifier voltage SB to the bit line sense amplifier 101, according to the overdriving control signal SAP11, the sense amplifier enable signal SAENB, and the pull-down control signal SAN.

A first switch 717 to a third switch 719 constituting the switching circuits 717 to 719 may be configured as PMOS transistors.

A source terminal of the first switch 717 may receive the first external voltage VDD, a gate terminal of the first switch 717 may receive the overdriving control signal SAP11, and a drain terminal of the first switch 717 may be coupled to an output node 720 of the driver 713. The driver 713 may drive the output node 720 according to at least one of the first external voltage VDD and the second external voltage VPPEXT.

The first switch 717 may apply the first external voltage VDD to the output node 720 when the overdriving control signal SAP11 is logic low.

A source terminal of the second switch 718 may be coupled to the output node 720, a gate terminal of the second switch 718 may receive the sense amplifier enable signal SAENB, and a drain terminal of the second switch 718 may be coupled to the sense amplifier 101.

The second switch 718 may apply the voltage level of the output node 720 as the first sense amplifier voltage RTO to the bit line sense amplifier 101 when the sense amplifier enable signal SAENB is logic low.

A source terminal of the third switch 719 may receive the ground voltage VSS, a gate terminal of the third switch 719 may receive the pull-down control signal SAN, and a drain terminal of the third switch 719 may be coupled to the sense amplifier 101.

The third switch 719 may apply the ground voltage VSS as the second sense amplifier voltage SB to the bit line sense amplifier 101 when the pull-down control signal SAN is logic low.

The sense amplifier control circuit 207 according to another exemplary embodiment may allow the overdriving operation of the bit line sense amplifier 101 to be performed through an associated operation of the driver 713 and the first switch 717 when the level of the first external voltage VDD is smaller than the internal reference voltage level, for example, when the voltage detection signal VDD_DET is inactivated to logic low.

The first switch 717 is operated and thus the driver 713 may generate the second driving voltage VCORE using the first external voltage VDD having a lower voltage level than the second external voltage VPPEXT.

When the level of the first external voltage VDD is equal to or larger than the internal reference voltage level, for example, when the voltage detection signal VDD_DET is activated to logic high, the first switch 717 is turned off and application of the first external voltage VDD through the output node 720 as the first sense amplifier voltage RTO to the bit line sense amplifier 101 may be interrupted.

The first switch 717 is turned off and thus the driver 713 may generate the second driving voltage VCORE using the second external voltage VPPEXT having the higher voltage level than the first external voltage VDD.

The above described embodiments of the present disclosure are intended to illustrate and not to limit the present disclosure. Various alternatives and equivalents are possible. The disclosure is not limited by the embodiments described herein. Nor is the disclosure limited to any specific type of semiconductor device. Other additions, subtractions, or modifications are obvious in view of the present disclosure and are intended to fall within the scope of the appended claims.

What is claimed is:

1. A semiconductor apparatus comprising:
    a sense amplifier configured to sense data transmitted through a data line; and
    a sense amplifier control circuit configured to detect whether a level of an external voltage is equal to or larger than an reference voltage level and control a power voltage of the sense amplifier according to a detection result,
    wherein the sense amplifier control circuit is configured to drop a level of the external voltage by a preset level and apply the level-dropped external voltage to the sense amplifier when the level of the external voltage is equal to or larger than the reference voltage level.

2. The semiconductor apparatus of claim 1, wherein the sense amplifier is coupled to a bit line pair.

3. The semiconductor apparatus of claim 1, further comprising a control signal generation unit configured to generate sense amplifier control signals according to a sense amplifier enable signal.

4. The semiconductor apparatus of claim 3, wherein the sense amplifier control circuit is configured to control the power voltage of the sense amplifier according to the sense amplifier control signals.

5. A semiconductor apparatus comprising:
    a sense amplifier configured to sense data transmitted through a data line;
    a voltage detector configured to detect whether a level of a first external voltage is equal to or larger than an internal reference voltage level and generate a voltage detection signal according to a detection result;
    a clamping circuit configured to output a first driving voltage by adjusting the level of the first external voltage according to the voltage detection signal; and
    a switching circuit configured to apply the first driving voltage to the sense amplifier according to sense amplifier control signals,
    wherein the clamping circuit is configured to drop a level of the first external voltage by a preset level and apply the level-dropped first external voltage to the sense amplifier according to the voltage detection signal.

6. The semiconductor apparatus of claim 5, wherein the sense amplifier is coupled to a bit line pair.

7. The semiconductor apparatus of claim 5, further comprising a driver configured to generate a second driving voltage according to the first external voltage or a second external voltage.

8. The semiconductor apparatus of claim 7, wherein the switching circuit is configured to apply the first driving voltage or the second driving voltage to the sense amplifier according to the sense amplifier control signals.

9. The semiconductor apparatus of claim 8, wherein the switching circuit includes:
   a first switch configured to apply the first driving voltage to the sense amplifier according to any one of the sense amplifier control signals; and
   a second switch configured to apply the second driving voltage to the sense amplifier according to an other one of the sense amplifier control signals.

10. The semiconductor apparatus of claim 7, wherein the second external voltage has a higher level than the first external voltage.

11. The semiconductor apparatus of claim 5, further comprising a driver configured to select the first external voltage or a second external voltage according to the voltage detection signal and generate a second driving voltage according to the selected external voltage.

12. The semiconductor apparatus of claim 11, wherein the driver is configured to select the first external voltage when a level of the voltage detection signal is a level which defines that the level of the first external voltage is equal to or larger than the internal reference voltage level and select the second external voltage having a higher level than the first external voltage when the level of the voltage detection signal is a level which defines that the level of the first external voltage is smaller than the internal reference voltage level.

13. A semiconductor apparatus comprising:
   a sense amplifier configured to sense data transmitted through a data line;
   a voltage detector configured to detect whether a level of a first external voltage is equal to or larger than an internal reference voltage level and generate a voltage detection signal according to a detection result;
   a switching circuit configured to apply a first driving voltage or a second driving voltage to the sense amplifier according to sense amplifier control signals; and
   a clamping circuit configured to output the second driving voltage by adjusting the level of the first external voltage according to the voltage detection signal and a sense amplifier enable signal,
   wherein the switching circuit is configured to interrupt application of the first driving voltage to the sense amplifier when the level of the first external voltage is equal to or larger than the internal reference voltage level,
   wherein the clamping circuit is configured to drop a level of the first external voltage by a preset level and apply the level-dropped first external voltage to the sense amplifier according to the voltage detection signal.

14. The semiconductor apparatus of claim 13, further comprising a driver configured to generate the second driving voltage according to the first external voltage or a second external voltage.

15. The semiconductor apparatus of claim 13, further comprising a logic gate configured to generate an overdriving control signal by combining any one of the sense amplifier control signals and the voltage detection signal.

16. The semiconductor apparatus of claim 15, wherein the switching circuit is configured to interrupt application of the first driving voltage to the sense amplifier according to the overdriving control signal.

17. The semiconductor apparatus of claim 13, wherein the sense amplifier is coupled to a bit line pair.

18. The semiconductor apparatus of claim 14, wherein the driver is configured to generate the second driving voltage according to the first external voltage or the second external voltage for a period that any one of the sense amplifier control signals and the voltage detection signal are activated.

* * * * *